United States Patent [19]
Meyer et al.

[11] Patent Number: 5,485,086
[45] Date of Patent: Jan. 16, 1996

[54] CONTINUOUS FLUOROSCOPIC MRI USING SPIRAL K-SPACE SCANNING

[75] Inventors: Craig H. Meyer, Palo Alto; Albert Macovski, Menlo Park, both of Calif.

[73] Assignee: The Board of Trustees of the Leland Stanford Junior University, Palo Alto, Calif.

[21] Appl. No.: 280,626

[22] Filed: Jul. 26, 1994

[51] Int. Cl.⁶ ........................................................ G01V 3/00
[52] U.S. Cl. .............................................. 324/307; 324/309
[58] Field of Search ...................................... 324/300, 306, 324/307, 309, 314

[56] References Cited

U.S. PATENT DOCUMENTS

5,402,067  3/1995  Pauly et al. ............................. 324/307

OTHER PUBLICATIONS

Meyer et al., Spiral Fluoroscopy, Proceedings of the Soc. of Mag. Res. in Med., vol. 1, 12th Annual Sci. Mtg., Aug. 14–20, 1993, New York, N.Y., p. 475.

Tweig, The K–Trajectory Formulation of the NMR Imaging Process with Applications in Analysis and Synthesis of Imaging Methods, Med. Phys. 10(5), Sep./Oct. 1983, pp. 610–621.

Ljunggren, A Simple Graphical Representation of Fourier–Based Imaging Methods, Jor. of Mag. Res., vol. 54, 1983, pp. 338–343 (May 1983).

*Primary Examiner*—Louis M. Arana
*Attorney, Agent, or Firm*—Townsend and Townsend and Crew

[57] ABSTRACT

Continuous fluoroscopic data is acquired using magnetic resonance imaging by applying magnetic gradients to excited nuclei whereby emitted magnetic resonance signals traverse interleaved spirals in k-space. The spirals can have tighter loops near the origin of k-space to emphasize lower frequencies.

12 Claims, 6 Drawing Sheets

CONTINUOUS FLUOROSCOPIC MRI USING SPIRAL K-SPACE SCANNING

The U.S. Government has rights in the invention pursuant to NIH grant No. CA-60948 to Stanford University.

BACKGROUND OF THE INVENTION

This invention relates generally to magnetic resonance imaging and more particularly the invention relates to continuous fluoroscopic imaging using spiral k-space scanning.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_0 = B_0 \cdot \gamma$$

Accordingly, by superimposing a linear gradient field, $B_z = Z \cdot G_z$, on the static uniform field, $B_0$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially-localize the FID signals in the plane. The angle of nuclear spin flip in response to an RF pulse excitation is proportional to the integral of the pulse over time.

A k-space interpretation of nuclei excitation is given by Pauly, Nishimura, and Macovski in "A k-space Analysis of Small-Tip-Angle Excitation," Journal of Magnetic Resonance 81, 43–56 (1989).

As is well-known in the art, the read-out of magnetic resonance signals can be formulated as a sampling in the Fourier spatial-frequency domain, or a k-space trajectory including spirals emanating outwardly in the frequency domain. See Twieg, "The k-Trajectory Formulation of the NMR Imaging Process with Applications in Analysis and Synthesis of Imaging Methods," Medical Physics 10(5), pp. 610–621, September/October 1983, and Ljunggren, "A Simple Graphical Representation of Fourier-Based Imaging Methods," Journal of Magnetic Resonance 54, pp. 338–343, 1983.

Spiral k-space scanning is particularly well suited to continuous, fluoroscopic acquisition. Recent developments in functional, interventional, and kinematic MRI suggest possible new applications for MR fluoroscopy. Heretofore, single-shot echo planar imaging has been used in a fluoroscopic mode with excellent time resolution, but high spatial resolution is not possible on a standard imager. Early MR fluoroscopy studies on standard imagers focused on 2DFT acquisition; the real-time capability of the systems were impressive, but the image sequences suffered from discontinuities when the raster scan passed through the origin in k-space. More recently, there have been attempts to reduce the discontinuities in 2DFT fluoroscopy by either acquiring the center of k-space more often than the edges or by only acquiring the edges of k-space at the start of the scan. As disclosed by Meyer et al. "Fast Spiral Coronary Artery Imaging" *Magnetic Resonance in Medicine*, 28:202–213 (1992), interleaved spiral scanning works well in a standard imager because a portion of the center of k-space is acquired during each interleaf, so that abrupt updates of the low spatial frequencies are avoided, The present invention is directed toward improved fluoroscopic magnetic resonance imaging using spiral k-space scanning.

SUMMARY OF THE INVENTION

In accordance with the invention, continuous magnetic resonance fluoroscopic images are obtained through use of nuclei excitation with interleaved k-space scanning. In accordance with a feature of the invention, temporal filtering is employed in which a sliding window is employed to combine signals from most recent spirals with selective weighting of spiral signals to emphasize newer signals and deemphasize older signals. In accordance with another feature of the invention, a modified spiral trajectory is employed with a tighter spiral near the origin of k-space to more rapidly update low-spatial frequencies. The higher spatial frequencies are updated more gradually through a loosening of the spiral as it progresses outwardly in k-space.

The invention and objects and features thereof will be more readily apparent from the following detailed description and appended claims when taken with the drawings.

DETAILED DESCRIPTION OF ILLUSTRATIVE EMBODIMENT

Figure 1A:
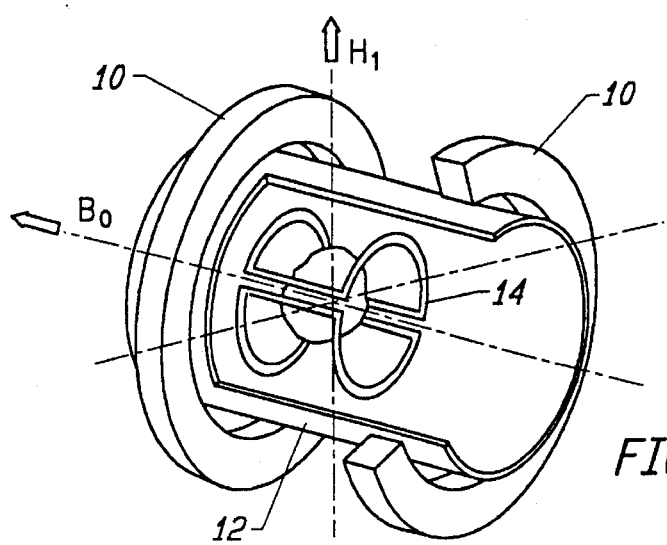
FIGS. 1A–1D illustrate the arrangement of conventional MRI apparatus and magnetic fields generated therein.
Figure 1B:
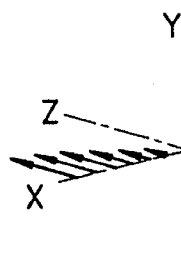
Figure 1C:
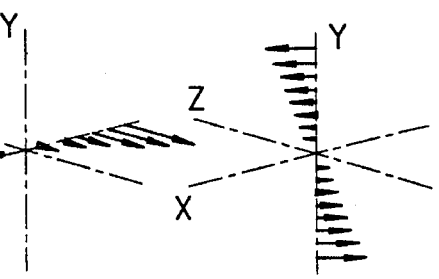
Figure 1D:
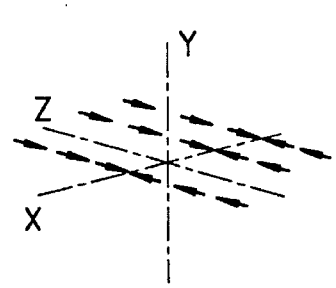

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983 pp. 338–350. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

Figure 2:
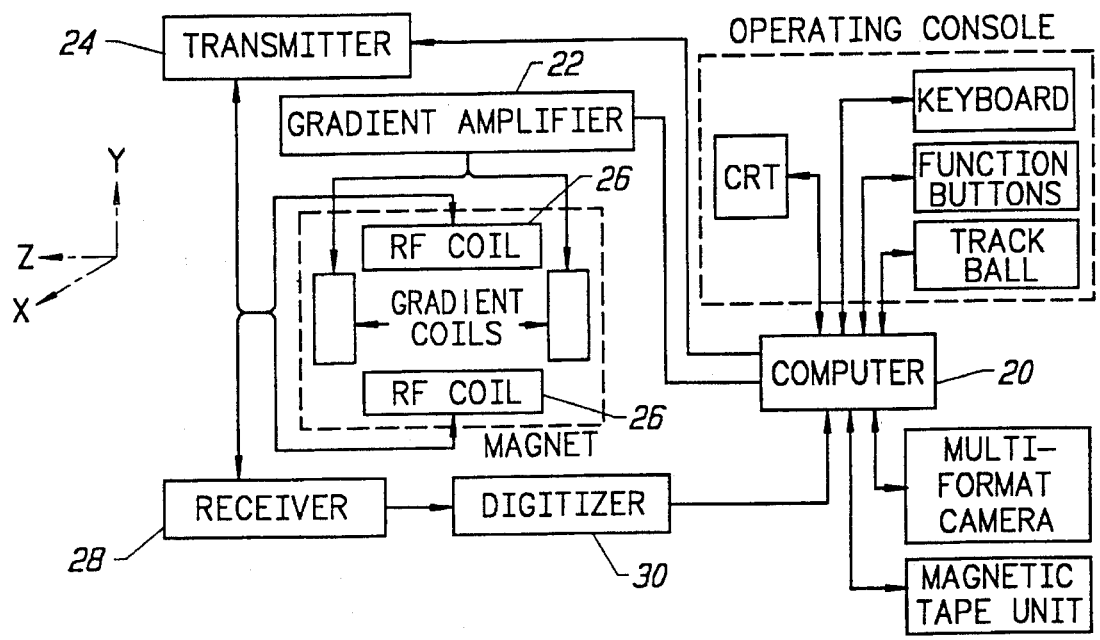
FIG. 2 is a functional block diagram of MRI imaging apparatus.

FIG. 2 is a functional block diagram of the imaging apparatus as disclosed in *NMR-A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency are controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
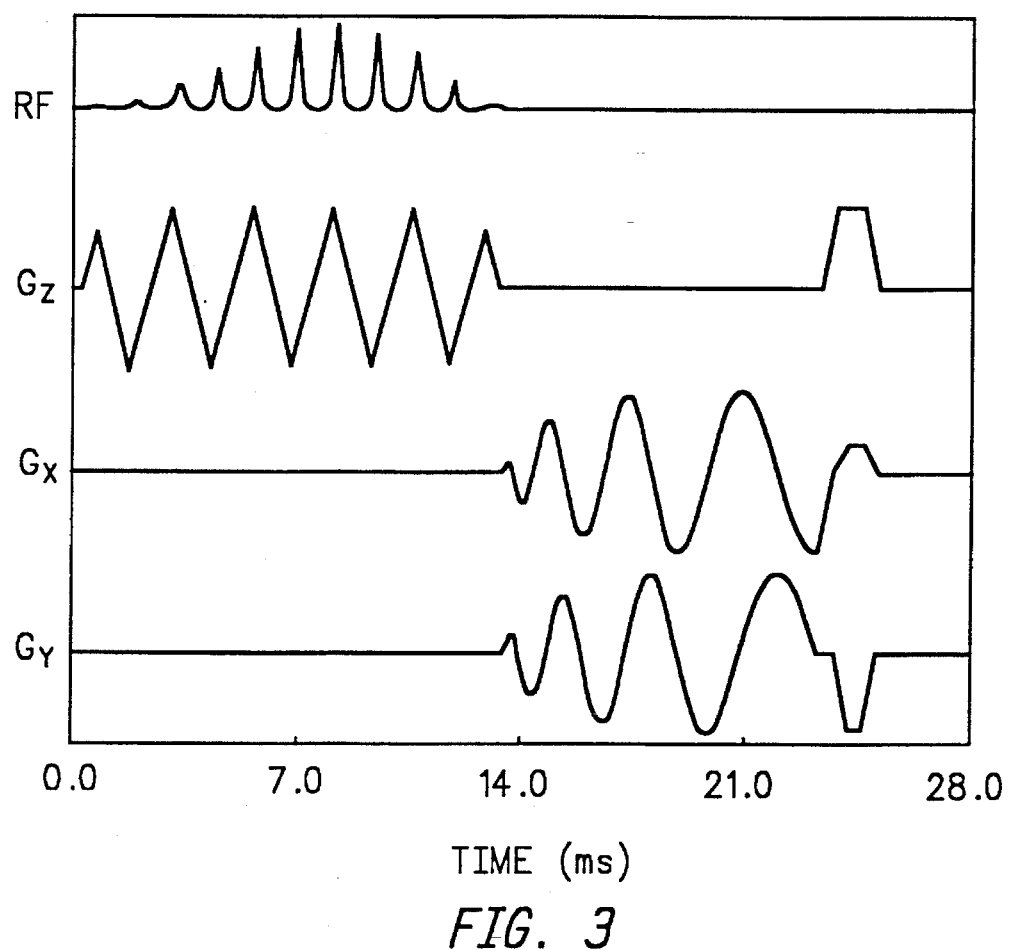
FIG. 3 illustrates a spiral fluoroscopic basic pulse sequence for exciting a slice for imaging in accordance with the invention.

The present invention is directed to the use of the described MRI apparatus for fluoroscopy, and particularly the use of spiral k-space scanning. FIG. 3 illustrates a pulse sequence for spiral fluoroscopic imaging in accordance with the invention. An RF excitation pulse is applied in the presence of a magnetic gradient Gz (assuming that the static magnetic field is along the Z axis) for slice selection, and the signals emitted from the excited nuclei are read-out in the presence of the Gx and Gy magnetic gradients for k-space scanning. In the k-space read-out, the starting point is an interleaved spiral sequence with N interleaves and with gradients numerically optimized under gradient risetime and amplitude constraints, as disclosed by Meyer et al. supra. The simplest spiral fluoroscopy sequence just repetitively acquires the interleaves with a short TR and uses the N most recent interleaves to reconstruct the image after each interleaf is acquired. With this system, object motion often leads to image artifacts, because the time difference between the acquisition of the first and last interleaves is (N−1)*TR. These artifacts can be reduced considerably with temporal filtering. One approach in accordance with the invention is to effectively convolve the data with a temporal window function. This operation is conceptually non-causal, which leads to a time-delay for a system with real-time reconstruction. Typically, a triangular convolution window is used. In this case, each image is reconstructed from the central readout and a weighted combination of the first N−1 readouts. If these are numbered from i=0 to 2*(N−1), the weighting applied to each interleaf in the reconstruction is 1−|N−i−1|/N. Thus, each interleaf in the reconstruction combines data from two different readouts N*TR apart, except for the central readout in the triangular window, which is used directly. From the perspective of the temporal Fourier domain, the rectangular window of length N has a sinc frequency response and the triangular window of length 2N−1 has a $sinc^2$ frequency response. The zero crossings of these responses are the same, so the overall temporal resolution is not degraded too much with the triangular window.

The sidelobes of the $sinc^2$ response are lower, which reduces temporal aliasing artifacts. The artifacts are also reduced because new data is gradually rather than abruptly introduced into the reconstruction.

Figure 4:
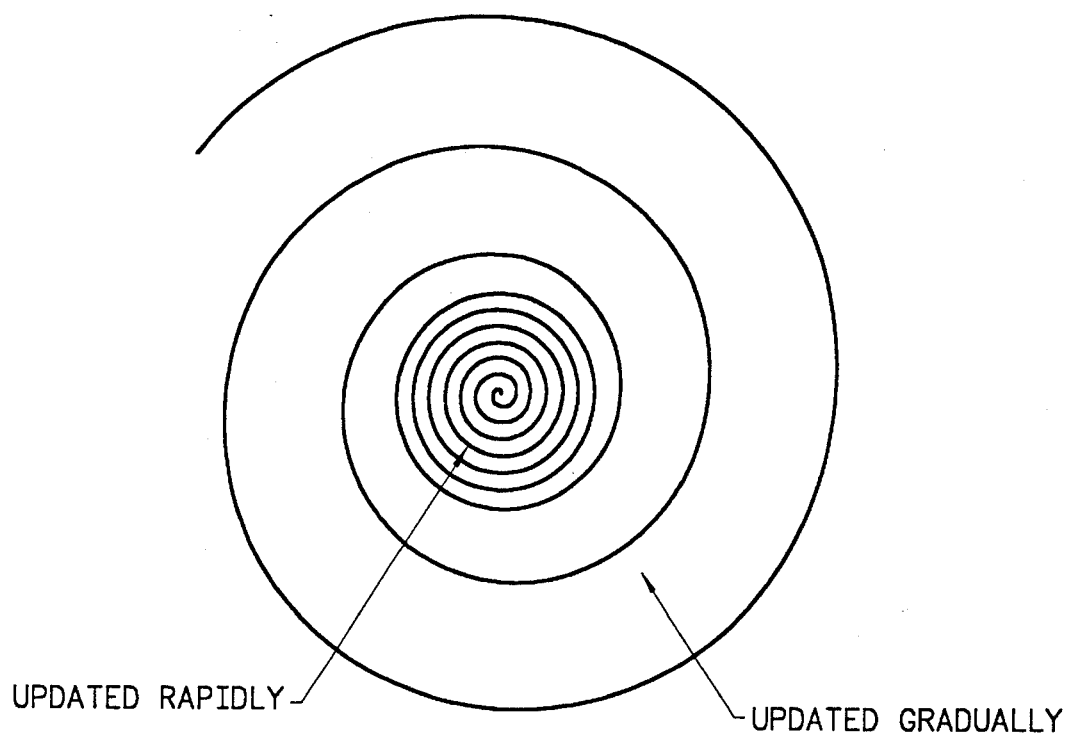
FIG. 4 illustrates a spiral k-space trajectory in accordance with the invention.

Psychophysical studies related to HDTV research have shown that higher frame rates are needed for lower spatial frequencies than for higher spatial frequencies. Modified spiral trajectories have been implemented that sample the lower spatial frequencies in a non-interleaved manner and the higher spatial frequencies in an interleaved manner. FIG. 4 illustrates the first part of one interleaf of such a k-space trajectory. The low spatial frequencies are updated after each readout and the higher spatial frequencies are filtered as in the previous example. To generate the gradients, we start with the expression $k_n = A\tau_n e^{i\theta_n}$, where $\theta_n = \theta_{n-1} + \omega_n \Delta \tau_n$.

Figure 5:
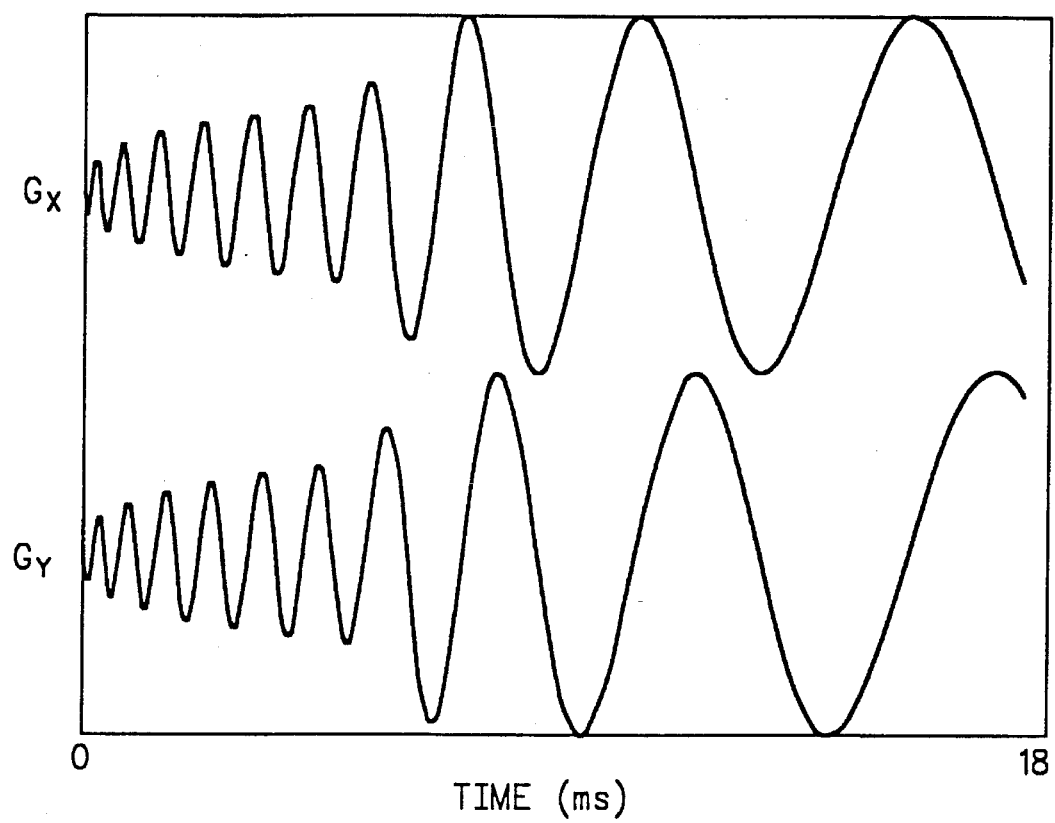
FIG. 5 illustrates magnetic gradients employed in realizing the k-space trajectory of FIG. 4.

This expression is numerically optimized subject to gradient risetime and amplitude constraints for n=0 to the number of gradient samples. The readout gradients are calculated as $g_n = k_n - k_{n-1}$, with appropriate initial conditions. Unlike the usual spiral trajectory, $\omega_n$ is variable; it starts at a value appropriate for single-shot imaging and then goes through a transition to $\omega_0/N$, where N is the number of interleaves. The optimization works best when $\omega$ has a continuous first derivative, which reduces the rise in the gradient slew rate while $\omega$ is changing. A Fermi function works well for the $\omega$ transition. The resulting optimized gradients (Gx, Gy) corresponding to the FIG. 4 trajectory are shown in FIG. 5. Note that sampling the center of k-space leads to decreased resolution for a given number of interleaves, both because of the redundant k-space coverage and because the resulting gradients spend more time in the risetime-limited regime. The choice of whether to repeatedly cover the center of k-space depends upon the FOV and the temporal and spatial resolution requirements of the application.

Figure 6C:
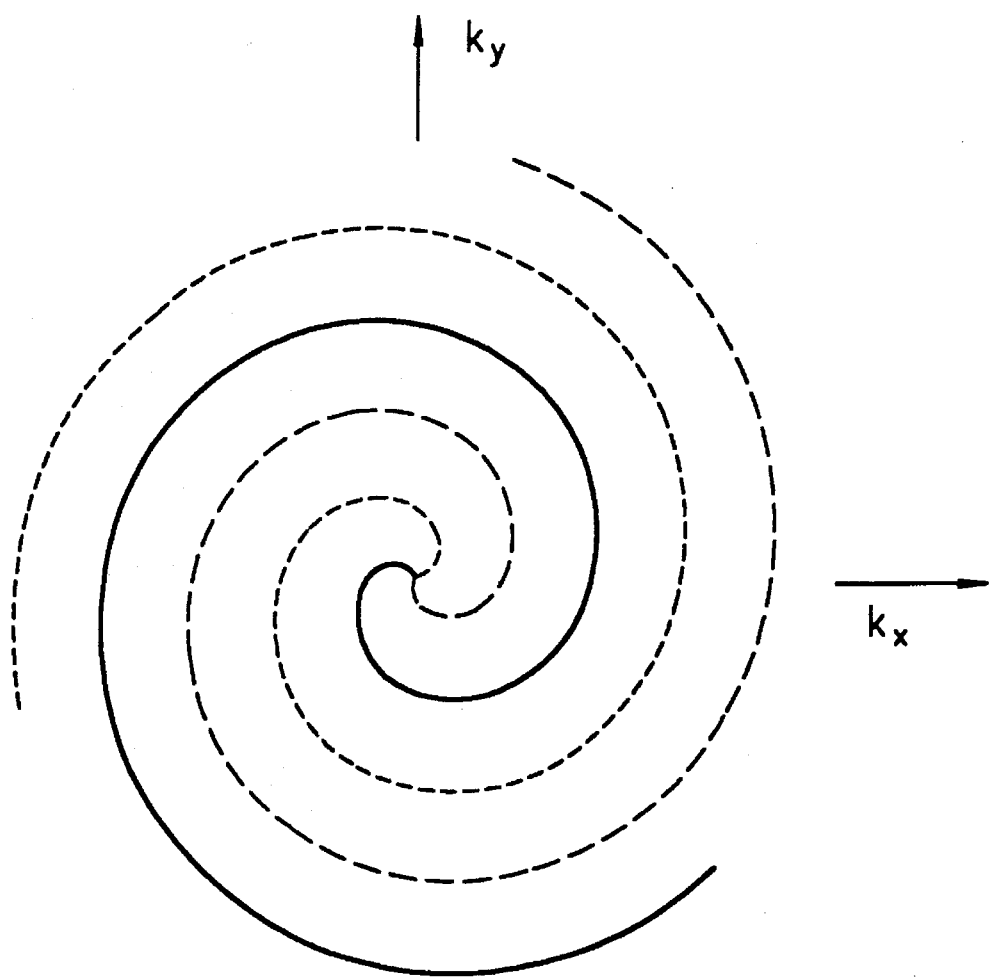
FIG. 6C illustrates a corresponding k-space trajectory.
Figure 6A:
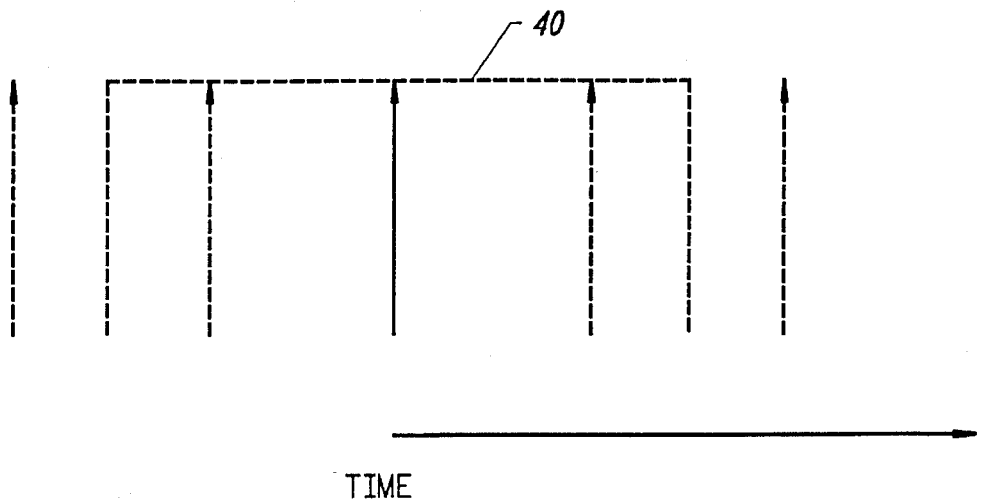
FIGS. 6A and 6B illustrate sliding window temporal filtering of signals in accordance with the invention.
Figure 6B:
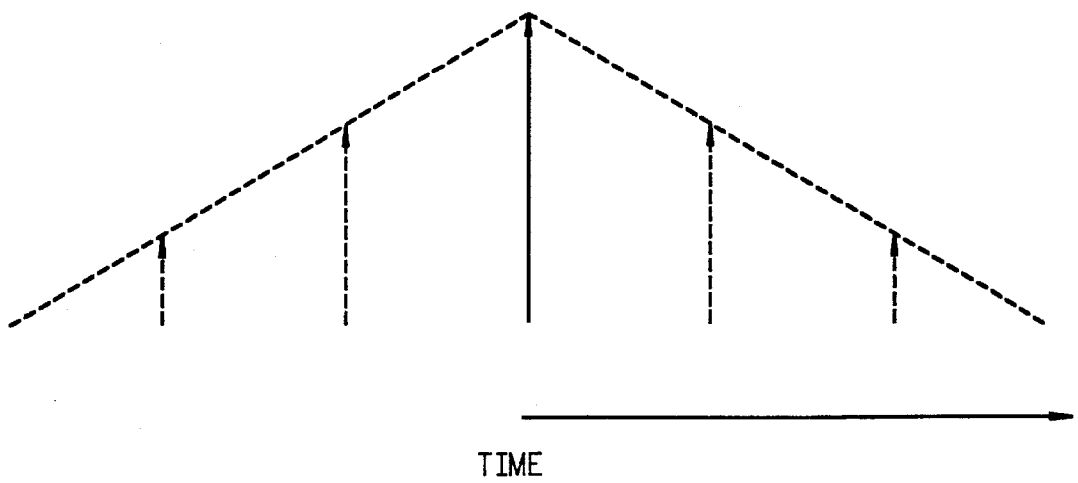

FIGS. 6A and 6B illustrate two embodiments of temporal filtering of the k-space signals for fluoroscopic imaging. In FIG. 6A the moving window 40 moves with time to combine the latest three detected signals for the fluoroscopic image. In FIG. 6A the signals are evenly weighted, but in FIG. 6B the moving window 40 combines the most recent five signals with the signals weighted to emphasize the third signal, as indicated by the sloped outline of the window. FIG. 6C illustrates a k-space trajectory of the corresponding excitations as indicated by solid and dashed lines.

The invention has been implemented on a GE Signa 1.5-T imager. Applications to date include tracking variable image contrast, breathing movies, and combined cardiac and breathing movies. With filtering, the results show surprisingly few artifacts, even though rapid heart motion is blurred for large values of N*TR.

Spiral imaging combined with temporal filtering in accordance with the invention has many advantages in fluoroscopic applications on a standard whole-body imager. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of acquiring continuous fluoroscopic data using magnetic resonance imaging comprising the steps of a) placing an object in a magnetic field, b) exciting nuclei in said object with an RF excitation pulse, c) applying magnetic gradients to said object whereby magnetic resonance signals emitted from said excited nuclei traverse a spiral in k-space, d) detecting magnetic resonance signals emitted from said exited nuclei, e) repeating steps b), c) and d) at different initial trajectories to create an interleaved set of spirals in k-space, and f) forming a fluoroscopic image based on said magnetic resonance signals.

2. The method as defined by claim 1 wherein said spirals in k-space has tighter loops near the origin of k-space whereby lower frequency signals are updated more rapidly.

3. The method as defined by claim 2 wherein step f) includes temporal filtering in forming said fluoroscopic image.

4. The method as defined by claim 3 wherein said step of temporal filtering includes selectively weighting said magnetic resonance signals.

5. The method as defined by claim 1 wherein step f) includes temporal filtering in forming said fluoroscopic image.

6. The method as defined by claim 5 wherein said step of temporal filtering includes selectively weighting said magnetic resonance signals.

7. Apparatus for acquiring continuous fluoroscopic data using magnetic resonance imaging comprising a) means for establishing a static magnetic field through an object, b) means for exciting nuclei in said object with RF excitation pulses, c) means for applying magnetic gradients to said object whereby magnetic resonance signals emitted from said excited nuclei traverse a spiral in k-space, d) means for detecting magnetic resonance signals emitted from said exited nuclei, e) said means for exciting and said means for applying magnetic gradients providing different initial trajectories to create an interleaved set of spirals in k-space, and f) means for forming a fluoroscopic image based on said magnetic resonance signals.

8. Apparatus as defined by claim 7 wherein said means for applying magnetic gradients causes said magnetic resonance signals to traverse a spiral in k-space having tighter loops near the origin of k-space whereby lower frequency signals are updated more rapidly.

9. Apparatus as defined by claim 8 wherein said means for forming a fluoroscopic image includes a temporal filter for combining a plurality of magnetic resonance signals.

10. Apparatus as defined by claim 9 wherein said temporal filter selectively weights said plurality of magnetic resonance signals.

11. Apparatus as defined by claim 7 wherein said means for forming a fluoroscopic image includes a temporal filter for combining a plurality of magnetic resonance signals.

12. Apparatus as defined by claim 11 wherein said temporal filter selectively weights said plurality of magnetic resonance signals.

* * * * *